Oct. 4, 1966

S. I. PERSSON 3,277,405

STRAIN FILTER UTILIZING SEMICONDUCTOR
DEVICE IN MECHANICAL OSCILLATION

Filed Sept. 30, 1963

INVENTOR
STEN I. PERSSON
BY
Donald Brown
AGENT 3,277,405

STRAIN FILTER UTILIZING SEMICONDUCTOR DEVICE IN MECHANICAL OSCILLATION

Sten I. Persson, Los Altos, Calif., assignor to Raytheon Company, Lexington, Mass., a corporation of Delaware Filed Sept. 30, 1963, Ser. No. 312,740

7 Claims. (Cl. 333—71)

This invention pertains to strain-sensitive junction semiconductors and, more particularly, to filter and oscillator devices utilizing strain sensitive junction semiconductors.

The invention uses as its principal element a strain-sensitive semiconductor transducer described in copending United States patent application, Serial No. 183,940, filed on March 30, 1962, and Serial No. 261,065, filed on February 26, 1963 by Wilhelm Rindner and assigned to the assignee of this invention. The strain transducer disclosed in the above-mentioned copending applications is particularly useful due to its high electrical sensitivity. For example, current changes in the orders of magnitudes greater than previously obtainable have been achieved. It is believed that this transducer exhibits the high sensitivity due to the spaced relationship between a junction formed by regions of semiconductor materials and the mechanism for producing a concentrated, nonuniform, anisotropic strain in said junction and the depth of the junction from a surface of said transducer.

It is the primary object of this invention to provide a novel strain-sensitive junction semiconductor transducer signal producing device.

It is a further object of this invention to provide a new and improved electromechanical strain-sensitive junction transducer filter device.

It is an additional object of this invention to provide a new and improved electromechanical strain-sensitive junction transducer oscillatory device.

In accordance with this invention there are disclosed filtering and oscillating devices utilizing strain sensitive transducer bodies. The devices of this invention provide both filtering and oscillations by stimulating vibrations within said transducer to obtain a signal at the self resonant frequency of the transducer body. The signal is then amplified by straining a junction or barrier within said transducer in accordance with the self resonant frequency vibrations of the body.

Other objects, features, and advantages will be apparent from the following detailed description taken in connection with the accompanying drawings, in which.

Figure 1:
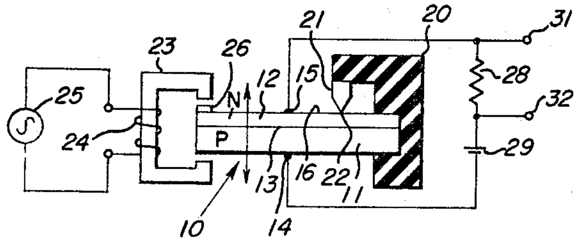
FIG. 1 is a schematic diagram of a filter of this invention utilizing the bending of a transducer to produce a strain within a junction of a semiconductor device comprising a portion of said filter.

FIG. 1 illustrates in schematic form a construction of a filter in accordance with this invention which is particularly suitable for filtering audio frequency signals. This filter provides the advantage of complete isolation between input and output signals. The filter comprises a semiconductor transducer body 10 of semiconductor materials, such as silicon, germanium, gallium arsenide or other equivalents. Transducer body 10 comprises an N doped semiconductor region 12 in contact with a P doped semiconductor region 11. Disposed between said N and P regions is a strain-sensitive shallow barrier or junction 13. It has been discovered as described in the aforementioned copending applications that junctions in the order of less than .010 inch from a mechanism, such as pointed object 22 for producing a strain in the junction 13, provides the best observed results. More particularly, junctions such as 13, less than .010 inch from a surface 16 to which there is applied a stress by a member, such as member 22, produce the highest electrical sensitivities.

It has also been discoverd as disclosed in the aforementioned copending U.S. applications that pointed members having bearing surfaces or tips with a radius of curvature less than about 250 microns, provide the best results.

A rigid support member is shown surrounding an end portion of the semiconductor body or device 10. This support holds or restricts the transducer body 10 in such a manner that a cantilever vibratory action or pivotal motion about a point in said body can be produced. The supporting member 20 has a member 21 having a pointed tip 22 in contact with a surface 16 of a semiconductor body 10. The pointed tip 22, as previously mentioned, is utilized to produce a strain confined to a small volume of junction 13. On the other end of semiconductor body 10 a magnetic material 26 is shown coating a top surface 16. An electromagnet 23 surrounds the end of the semiconductor body 10 having mounted thereon said magnetic material. The electromagnet 23 has an input winding 24 to which there is applied an input signal by a signal generator 25. This input signal is utilized to provide alternating magnetic fields in the vicinity of magnetic material 26 so as to vibrate the semiconductor body by producing motion at one end of the body 10. The semiconductor device 10 has a sharp self resonance which varies as a function of the volume and dimensions of the semiconductor body which will be disclosed at a later time.

Electrical contacts are made at ohmic contacts 14 and 15, connected to semiconductor regions 11 and 12, respectively. Biasing is applied across the junction or barrier 13 by a battery 29, which is connected to a resistor 28 at one end and to ohmic contact 14 at its other end. Resistor 28 is coupled to ohmic contact 15. The output from the filter is obtained across resistor 28 by tapping the connections 31 and 32.

The operation of this device is as follows: an input signal provided by the signal generator 25 produces a vibratory motion in a direction of the arrows shown in FIG. 1 so as to cause a vibratory motion in the semiconductor body 10. This motion produces vibrations which are particularly pronounced at the self resonant frequency of the body which is related to the dimensions and the volume of the semiconductor body. These pronounced vibrations at the self resonant frequency cause a strain to be produced in the junction 13. In this manner, the self resonance of the body in combination with the amplification provided by the strain produced within the junction barrier of the semiconductor body 10 provides an amplified filtered output signal across terminals 31 and 32. This output signal is a signal which has been filtered from the input signal provided by the signal generator 25, and is a function of the self resonant frequency of the semiconductor body 10, and its amplitude is a function of the strain within the junction 13 and the battery voltage from battery 29.

The biasing shown for the device of FIG. 1 is of such a polarity as to reverse bias the junction 13, thereby operating the transducer in the reverse current condition. Other embodiments of the filter could be constructed with a forward biasing of the junction 13 so as to operate the transducer of FIG. 1 in a forward conduction condition.

Figure 2:
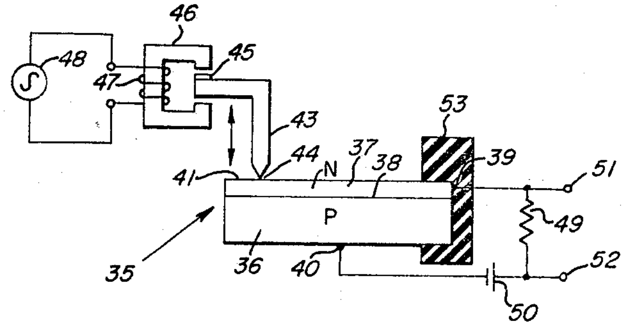
FIG. 2 is a schematic diagram of another embodiment of an electromechanical filter in accordance with this invention.

Referring now to FIG. 2, there is disclosed another embodiment of a strain transducer filter in accordance with this invention. The semiconductor transducer body 35 is shown comprised of a first P region of semiconductor material 36 in contact with an N region of semiconductor material 37. A junction or barrier 38 is shown between the semiconductor regions 36 and 37. The semiconductor body 35 is rigidly secured at one end by a supporting block 53. Block 53 permits the semiconductor body 35 to vibrate or move in a cantilever fashion. Vibrations are produced within this semiconductor body 35 by a member 43 having a pointed area 44 in contact with surface 41 of body 35. This pointed member 44, in addition to vibrating the body 35, produces a strain confined to a small volume of the junction 38.

An input signal to be filtered is provided by a signal generator 48 which supplies a signal to an input winding 47 wound on an electromagnet 46. A magnetic material 45 is shown rigidly secured to member 43 in such a manner that motion of member 43 in a direction shown by the double arrow in FIG. 2 will provide vibration of the semiconductor body 35 in addition to strain confined to a small volume of the semiconductor junction 38. Output connections from this filter device is made at ohmic contacts 39 and 40, which are coupled to semiconductor regions 37 and 36, respectively. Junction 38 is reverse biased by a battery 50 which is coupled at one end to ohmic contact 40 and at its other end to an output resistance 49. Resistance 49 is ohmically coupled to semiconductor region 37 at the junction 39. The output from the filter is taken across resistor 49 at connections 51 and 52.

The device of FIG. 2 operates in the following manner. An input signal produces motion of the member 43, which causes the semiconductor body to vibrate in such a manner that a sharp self resonant frequency exists within the semiconductor body 35. These vibrations are amplified so as to produce a filtered signal across connections 51 and 52.

Although exact dimensions of a transducer body are not claimed in this application, a transducer body for FIGS. 1 and 2 having the following dimensions: length .200 inch, height .006 inch, and width .010–.015 inch will provide filtering action in the kilocycle frequency range.

Figure 3:
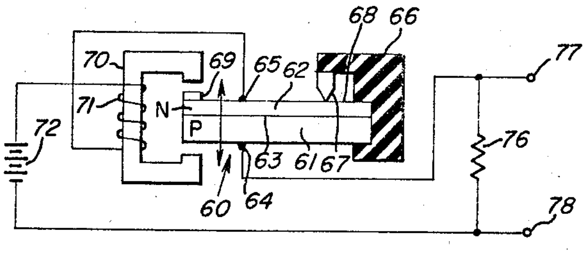
FIG. 3 is a schematic diagram of an oscillator of this invention utilizing a pointed object to produce a strain within a junction of a semiconductor device comprising a portion of said oscillator.

In FIG. 3 there is disclosed a semiconductor strain transducer oscillator comprised of a semiconductor transducer body 60. Transducer body 60 is comprised of a first N-type region of semiconductor material 62 mounted in contact with a second P-type region of semiconductor material 61. A junction or barrier region 63 is formed between said N and P regions. One end of the semiconductor body 60 is rigidly mounted in a support 66 so as to permit cantilever motion of the opposite unsecured end of the semiconductor body 60 as shown by the arrows in FIG. 3. A pointed member 67 having a radius of curvature less than 250 microns is shown in contact with a top surface 68 of the semiconductor body 60. This member provides a concentrated strain within the junction or barrier region 63 which varies in accordance with the motion of the semiconductor body 60. The semiconductor body 60 has mounted on its unsecured end a magnetic material 69, electromagnet 70 being positioned about the magnetic material 69 so as to permit a signal which is coupled into an input winding 71 to produce electromagnetic attraction of the semiconductor body 60 and accordingly, motion in the direction of the arrows shown in FIG. 3.

A D.C. bias supply is shown at 72 and is coupled to one end of winding 71. The other end of winding 71 is coupled to ohmic contact 65 which is in contact with semiconductor region 62. Semiconductor region 61 through ohmic contact 64 is connected to a resistance 76 and then coupled back into battery 72. Connections 77 and 78 across resistors 76 provide an output signal from this device. The oscillator of FIG. 3 oscillates due to a feedback loop providing a signal to sustain oscillations. Movement of one end of the semiconductor body 60 causes vibrations in the semiconductor body 60. Due to the volume and the dimensions of the semiconductor body 60, a signal related to the self resonant frequency of the body will be provided. This signal at the frequency of self resonance will then be amplified due to the application of a stress by pointed member 67 producing a strain within the junction of barrier region 63. A portion of this amplified signal is then fed back into the input portion of the circuit in order to sustain or maintain oscillations.

Figure 4:
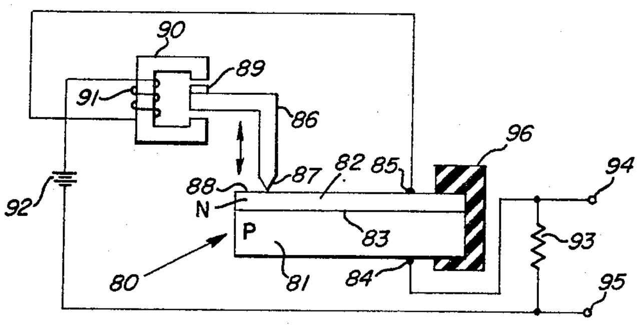
FIG. 4 is a schematic diagram of another embodiment of an oscillator in accordance with this invention.

Referring to FIG. 4, an additional embodiment of an oscillatory circuit of the type shown in FIG. 3 is disclosed. A semiconductor transducer body 80 having a first region of semiconductor material 81, and a second region of semiconductor material 82 having a junction or barrier region 83 therebetween is shown rigidly mounted at one end in a support 96. A bearing member 86 having a pointed tip 87 of the aforementioned preferred dimension is shown in contact with a top surface 88 on the semiconductor body 80. Magnetic material 89 is utilized to coat a region of the member 86.

An electromagnet 90 having an input winding 91 is shown for electromagnetically attracting the magnetically coated member 86 in order to provide motion of the member 86 as shown by the arrows of FIG. 4. The input winding 91 is connected at one end to a D.C. supply 92 and at its other end is coupled to ohmic contact 85 mounted on semiconductor region 82. An ohmic contact 84 in contact with semiconductor region 81 is coupled through a resistance device 93 back to the D.C. source 92. Connections 94 and 95 are shown for coupling an output signal to a suitable load device. The operation of this device is substantially similar to that of the device of FIG. 3. The member 86 causes vibrations of the semiconductor body 80. Inasmuch as the semiconductor body 80 is of a volume and has dimensions which produce a self resonance at a particular frequency, vibrations of this self resonance frequency will predominate. This frequency of vibration will then be amplified due to the simultaneous production of a strain within the barrier or junction region 83 and will appear as an output signal across the resistance 93. A portion of this signal is then fed back into the system to sustain oscillations of this device.

Although the filter and oscillators of this invention have been disclosed with particular reference to the aforementioned semiconductor material types, other types of semiconductor materials could be utilized. Furthermore, refinements in mounting and in members for producing these devices could be made without departing from the spirit and scope of the invention. Accordingly, it is desired that this invention not be limited except by the appended claims.

What is claimed is:

1. A strain transducer device comprising a body of semiconductor material having a P-type region and an N-type region having therebetween a P-N junction disposed at a depth of less than .010 inch from an exposed surface of said body, means for physically restricting motion of a portion of said body, a magnetic material coating a portion of a surface of said body removed from said restricted portion, means for electromagnetically attracting said magnetic material in order to move an unrestricted portion of said body in accordance with an input signal to be filtered, said body of semiconductor material having dimensions which provide a sharp self resonance at a particular frequency contained within said input signal, and means for producing a strain in said junction substantially at said frequency of self resonance of said body.

2. A device in accordance with claim 1 wherein said means for producing a strain comprises a member bearing on said exposed surface of said body substantially parallel to and closest to said junction with a pointed tip having a radius of curvature less than about 250 microns, and said means for attracting said material comprises an electromaget having its opposite poles extending on opposite sides of the body, one of the poles being disposed adjacent said magnetic material, said magnetic material being of miniature dimensions.

3. A strain transducer device comprising a body of semiconductor material having a P-type region and an N-type region with a P-N junction therebetween disposed at a depth of less than about .010 inch from an exposed surface of said body substantially parallel to said junction, means for physically restricting motion of a portion of said body, electromagnetic means for moving an unrestricted portion of said body in accordance with an input signal to be filtered, said body of semiconductor material having dimensions which provide a sharp self-resonance at a particular frequency contained within said input signal, and means for producing a strain in said junction substantially at said frequency of self-resonance of said body.

4. A device as set forth in claim 3 wherein said means for producing a strain comprises a member having a pointed tip with a radius of curvature less than about 250 microns bearing on said exposed surface of said body, and said means for moving an unrestricted portion of said body comprises an electromagnet having its opposite poles extending on opposite sides of the body.

5. A device as set forth in claim 3 wherein said means for producing a strain comprises a pointed object carried by a rigid support and having the point thereof bearing on said exposed surface of the body.

6. A device as set forth in claim 3 wherein said electromagnetic means comprises an electromagnet having opposite poles overlying said unrestricted portion of the body and having an input winding thereon for receiving said input signal.

7. A device as set forth in claim 3 wherein said electromagnetic means comprises an electromagnet having an input winding thereon for receiving said input signal, and said means for producing a strain comprises an elongated member having a point at one end bearing on said exposed surface of the body and having another portion thereof disposed between the poses of the electromagnet.

References Cited by the Examiner

UNITED STATES PATENTS

| | | | |
|---|---|---|---|
| 2,167,254 | 7/1939 | Skellet | 331—107 |
| 2,469,569 | 5/1949 | Ohl | 331—107 |
| 2,553,491 | 5/1951 | Shockley | 171—330 |
| 2,794,863 | 6/1957 | Van Roosbroech | 333—71 |
| 2,898,477 | 8/1959 | Hoestery | 333—30 |
| 2,929,885 | 3/1960 | Mueller | 179—121 |
| 2,943,279 | 6/1960 | Mattiat | 333—72 |
| 3,174,122 | 3/1965 | Fowler et al. | 333—72 |
| 3,185,935 | 5/1965 | White | 333—30 |

OTHER REFERENCES

"Amplification of Ultra-Sonic Waves," White Journal of Applied Physics, vol. 33, No. 8, August 1962, pp. 2547–2554.

HERMAN KARL SAALBACH, *Primary Examiner.*

J. KOMINSKI, C. BARAFF, *Assistant Examiners.*